(12) United States Patent
Lee et al.

(10) Patent No.: US 8,835,742 B2
(45) Date of Patent: Sep. 16, 2014

(54) THERMOELECTRIC DEVICE AND METHOD OF MANUFACTURING THE SAME

(75) Inventors: Eun-kyung Lee, Suwon-si (KR); Byoung-lyong Choi, Seoul (KR); Sang-jin Lee, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 517 days.

(21) Appl. No.: 12/501,582

(22) Filed: Jul. 13, 2009

(65) Prior Publication Data

US 2010/0193003 A1 Aug. 5, 2010

(30) Foreign Application Priority Data

Feb. 2, 2009 (KR) .......................... 10-2009-0008045

(51) Int. Cl.
*H01L 35/32* (2006.01)
*H01L 35/26* (2006.01)

(52) U.S. Cl.
CPC .............. *H01L 35/26* (2013.01); *H01L 35/32* (2013.01)
USPC ....................................................... 136/205

(58) Field of Classification Search
CPC ........ H01L 35/32; B82Y 30/00; B82Y 20/00; B82Y 99/00
See application file for complete search history.

(56) References Cited

U.S. PATENT DOCUMENTS

| | | | |
|---|---|---|---|
| 6,297,095 B1 | 10/2001 | Muralidhar et al. | |
| 7,098,393 B2 | 8/2006 | Fleurial et al. | |
| 8,087,151 B2 * | 1/2012 | Park et al. | 29/592.1 |
| 2002/0170590 A1 * | 11/2002 | Heremans et al. | 136/240 |
| 2003/0047204 A1 | 3/2003 | Fleurial et al. | |
| 2005/0257821 A1 | 11/2005 | Ramanathan et al. | |
| 2006/0102224 A1 * | 5/2006 | Chen et al. | 136/203 |
| 2006/0216528 A1 * | 9/2006 | Lee et al. | 428/432 |
| 2008/0135081 A1 * | 6/2008 | Sharifi et al. | 136/207 |
| 2008/0246020 A1 * | 10/2008 | Kawashima et al. | 257/24 |
| 2009/0010056 A1 * | 1/2009 | Kuo et al. | 365/184 |
| 2010/0212328 A1 * | 8/2010 | Murai et al. | 62/3.2 |
| 2010/0276667 A1 * | 11/2010 | Kim et al. | 257/24 |

FOREIGN PATENT DOCUMENTS

| | | | | |
|---|---|---|---|---|
| JP | 2005-093454 A | | 4/2005 | |
| KR | 100632383 B1 | | 9/2006 | |
| KR | 1020070034249 A | | 3/2007 | |
| KR | 100779090 B1 | | 11/2007 | |
| KR | 100851281 B1 | | 8/2008 | |
| WO | WO 2008/149871 | * | 12/2008 | .............. H01L 35/26 |

* cited by examiner

*Primary Examiner* — Jennifer Michener
*Assistant Examiner* — Christopher Danicic
(74) *Attorney, Agent, or Firm* — Cantor Colburn LLP

(57) ABSTRACT

A thermoelectric device and a method of manufacturing the same are provided. The thermoelectric device may include a nanowire having nanoparticles which are disposed on one of an exterior surface of the nanowire and an interior of the nanowire.

20 Claims, 12 Drawing Sheets

THERMOELECTRIC DEVICE AND METHOD OF MANUFACTURING THE SAME

CROSS-REFERENCE TO RELATED APPLICATION

This application claims priority to Korean Patent Application No. 10-2009-0008045, filed on Feb. 2, 2009, and all the benefits accruing therefrom under 35 U.S.C. §119, the contents of which in its entirety are herein incorporated by reference.

BACKGROUND

1. Field

One or more exemplary embodiments relate to a thermoelectric device and a method of manufacturing the same.

2. Description of the Related Art

Thermoelectric conversion refers to energy conversion between thermal energy and electrical energy. Electricity is generated when a temperature difference exists between two ends of a thermoelectric material, which is referred to as the Seebeck effect. Further, a temperature gradient is generated between the two ends of the thermoelectric material when an electrical current flows in the thermoelectric material, which is referred to as the Peltier effect.

Heat generated from a computer, an engine of a car, or other devices or structures, may be converted into electrical energy using the Seebeck effect and various cooling systems using no refrigerant may be realized using the Peltier effect. As interest in new forms of energy development, wasted energy recycling, and environmental protection, has increased in recent times, interest in thermoelectric devices has also particularly increased.

The efficiency of a thermoelectric device is determined by a performance coefficient of a thermoelectric material, also referred to as a figure of merit ("ZT") coefficient. The ZT coefficient, which is non-dimensional, may be represented by Equation 1.

$$ZT = \frac{S^2 \sigma}{k} T \qquad \text{(Equation 1)}$$

In Equation 1, the ZT coefficient is proportional to a Seebeck coefficient S and electrical conductivity $\sigma$ of thermoelectric material and is inversely proportional to thermal conductivity k of thermoelectric material. Here, the Seebeck coefficient S represents the magnitude of a voltage generated according to variations in unit temperature ("dV/dT").

However, the Seebeck coefficient S, the electrical conductivity $\sigma$, and the thermal conductivity k are not independent parameters and thus a thermoelectric device having a high ZT coefficient, indicating a high efficiency, may not be easily realized.

SUMMARY

One or more exemplary embodiments include an efficient thermoelectric device.

One or more exemplary embodiments include a method of manufacturing the thermoelectric device.

Additional aspects, advantages and features will be set forth in part in the description which follows and, in part, will be apparent from the description, or may be learned by practice of the exemplary embodiments.

One exemplary embodiment of a thermoelectric device includes a nanowire having nanoparticles which are disposed on one of an exterior surface of the nanowire and an interior of the nanowire.

In one exemplary embodiment, the nanoparticles may be disposed on the exterior surface of the nanowire.

In one exemplary embodiment, the nanowire may include at least one of a group IV semiconductor, a group III-V semiconductor, a group II-VI semiconductor, and an oxide semiconductor, or include a group VI element and at least one of a group IV element and a group V element. For example, the nanowire may be formed of silicon (Si), a silicon rich oxide ("SRO"), or a silicon rich nitride ("SRN"). The nanowire may be doped with a conductive impurity.

In one exemplary embodiment, the nanoparticles may be disposed in the interior of the nanowire.

In one exemplary embodiment, the nanowire may include a core portion and a shell portion, and the nanoparticles may be disposed on an interior surface between the core portion and the shell portion, or be disposed on the interior surface and in the shell portion.

In one exemplary embodiment, the core portion may include at least one of a group IV semiconductor, a group III-V semiconductor, a group II-VI semiconductor, and an oxide semiconductor, or include a group VI element and at least one of a group IV element and a group V element.

In one exemplary embodiment, the shell portion may include at least one of an oxide and a nitride.

In one exemplary embodiment, the core portion may include at least one of Si, a SRO, or a SRN.

In one exemplary embodiment, the shell portion may include at least one of s silicon oxides ("SiOx") (here, 0<x≤2) and silicon nitrides ("SiNy") (here, 0<y≤4/3).

In one exemplary embodiment, the core portion may include a conductive impurity.

In one exemplary embodiment, the nanoparticles may include at least one selected from the group consisting of Si, germanium (Ge), bismuth (Bi), tellurium (Te), antimony (Sb), lead (Pb), tin (Sn), indium (In), silver (Ag), zinc (Zn), ytterbium (Yb), cobalt (Co), cerium (Ce), iron (Fe), cesium (Cs), and mixtures thereof.

In one exemplary embodiment, the nanoparticles may include Si.

In one exemplary embodiment, the nanoparticles may include a conductive impurity.

In one exemplary embodiment, the thermoelectric device may be at least one of a thermoelectric generator, a thermoelectric cooler, and a heat sensor.

In one exemplary embodiment, the thermoelectric device may include a plurality of the nanowires.

In one exemplary embodiment, the plurality of the nanowires may include at least one n-type nanowire and/or at least one p-type nanowire.

In one exemplary embodiment, the nanoparticles may be a photoelectric element.

In one exemplary embodiment, a method of manufacturing a thermoelectric device includes providing a nanowire; and providing a plurality of nanoparticles on one of an exterior surface of the nanowire and an interior surface of the nanowire.

In one exemplary embodiment, the nanowire may be a SRO nanowire.

In one exemplary embodiment, the nanowire may be provided by using at least one of a vapor-liquid-solid ("VLS") method, a solid-liquid-solid ("SLS") method, and a non-catalytic growing method.

In one exemplary embodiment, the plurality of nanoparticles may be provided by annealing the nanowire.

In one exemplary embodiment, the method may further include doping the nanowire with a conductive impurity.

In one exemplary embodiment, the conductive impurity may be injected while the nanowire is grown or doped after the nanowire is grown.

In one exemplary embodiment, the method may further include etching a surface portion of the nanowire after providing the plurality of nanoparticles, if the plurality of nanopaticles are provided in the interior of the nanowire.

BRIEF DESCRIPTION OF THE DRAWINGS

The above and other aspects, advantages, and features of exemplary embodiments will become more apparent by describing in further detail exemplary embodiments thereof with reference to the accompanying drawings, in which.

DETAILED DESCRIPTION

Figure 1:
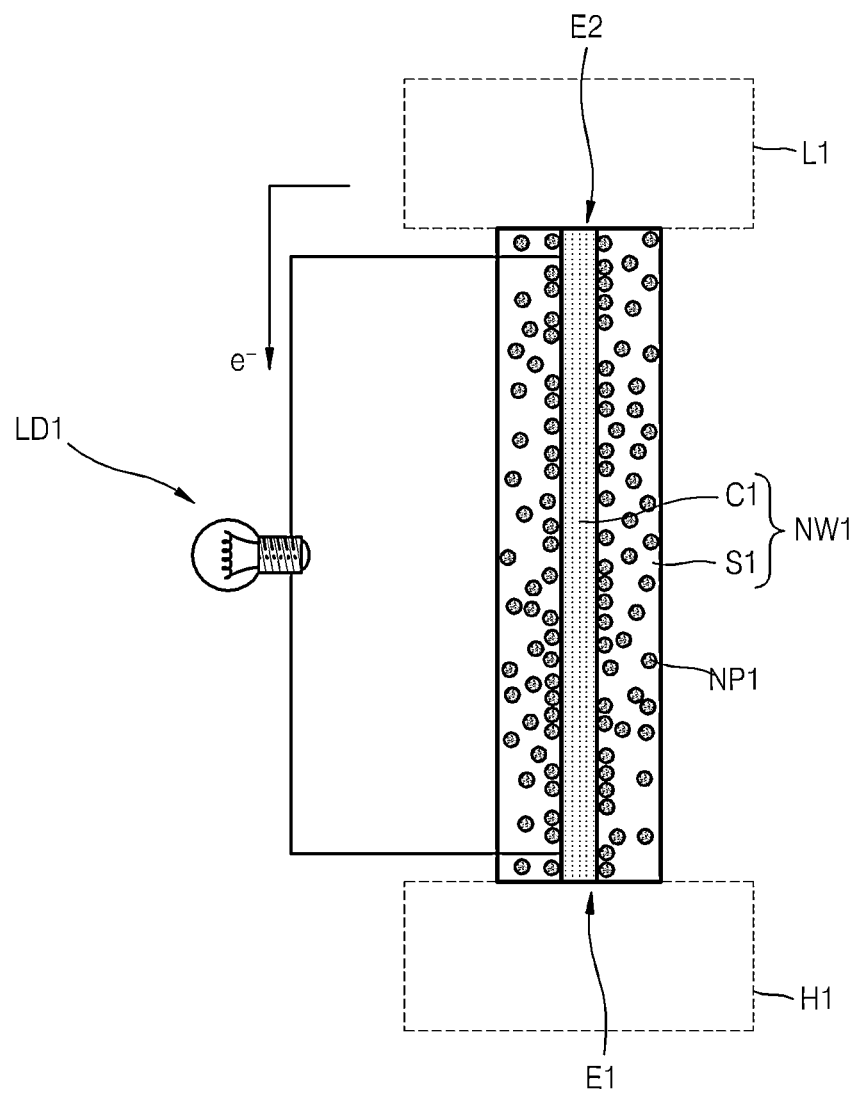
FIG. 1 is a cross-sectional diagram of an exemplary embodiment of a thermoelectric device.

The invention now will be described more fully hereinafter with reference to the accompanying drawings, in which embodiments of the invention are shown.

This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, etc. may be used herein to describe various elements, components, regions, layers and/or sections, these elements components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an," and "the," are intended to include the plural forms as well, unless the context clearly indicates otherwise. It will be further understood that the terms "comprises," and/or "comprising," or "includes," and/or "including," when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

In the drawings, the thicknesses of layers and regions are exaggerated for clarity. Like reference numerals in the drawings denote like elements.

FIG. 1 is a cross-sectional diagram of an exemplary embodiment of a thermoelectric device.

Referring to FIG. 1, the thermoelectric device may have a structure in which a nanowire NW1 and a plurality of nanoparticles NP1 are combined. The nanowire NW1 may include a core portion C1 and a shell portion S1. In one exemplary embodiment, electrical conductivity σ of the core portion C1 may be greater than the electrical conductivity σ of the shell portion S1. In the present exemplary embodiment, the nanoparticles NP1 may be formed on a surface between the core portion C1 and the shell portion S1, and throughout the shell portion S1. Materials comprising the core portion C1, the shell portion S1, and the nanoparticles NP1 will be described in further detail later.

A load device LD1 may be connected to one end E1 and another end E2 of the nanowire NW1. In one exemplary embodiment, the one end E1 and the another end E2 are located distal to one another with the body of the nanowires NW1 disposed between the two ends E1 and E2. Electrodes (not shown) may be respectively connected to the one end E1 and the other end E2 of the nanowire NW1, and may be connected to the load device LD1. Exemplary embodiments of the load device LD1 include a device that consumes electricity generated from the nanowire NW1. Alternative exemplary embodiments include configurations wherein the load device LD1 may be replaced by a unit for storing electricity, such as a storage battery.

If the one end E1 of the nanowire NW1 contacts a high-temperature region H1 and the other end E2 of the nanowire NW1 contacts a low-temperature region L1, electricity may be generated from the nanowire NW1 due to a thermoelectric effect. For example, in one exemplary embodiment electrons e– may move from the one end E1 contacting the high-temperature region H1 to the other end E2 contacting the low-temperature region L1. The electrons e– may then flow through the load device LD1 which is connected to the ends of the wire E1 and E2. Since in the present exemplary embodiment the electrical conductivity σ of the core portion C1 may be greater than the electrical conductivity σ of the shell portion S1 in nanowire NW1, the electrons e– may mostly flow through the core portion C1. If the core portion C1 is heavily doped with a conductive impurity, the core portion C1 may have high electrical conductivity σ and an electrical current may easily flow through the core portion C1, which means the nanowire NW1 has a high electrical conductivity σ.

The nanoparticles NP1 may suppress a transfer of heat in the nanowire NW1. In more detail, phonons causing a transfer of heat may be scattered by the nanoparticles NP1 and thus, a moving speed of heat may be greatly reduced. Accordingly, the nanowire NW1 in which the nanoparticles NP1 are formed may have a very low thermal conductivity k.

In addition, since the charge density of state near the Fermi level is high in a nanostructure in comparison to a bulk body, a Seebeck coefficient S of the nanostructure may be greater than that of the bulk body. Thus, the structure in which the nanowire NW1 and the nanoparticles NP1 are combined may have a relatively high Seebeck coefficient S.

As such, the nanowire NW1 in which the nanoparticles NP1 are formed may have a high electrical conductivity σ, a low thermal conductivity k, and a relatively high Seebeck coefficient S, which allows realization of a thermoelectric device having a high ZT coefficient as per Equation 1 (reproduced here for clarity), indicating a high efficiency.

$$ZT = \frac{S^2 \sigma}{k} T \qquad \text{(Equation 1)}$$

Materials comprising the core portion C1, the shell portion S1, and the nanoparticles NP1, and properties thereof will now be described in more detail.

The core portion C1 may contain at least one of a group IV semiconductor, a group III-V semiconductor, a group II-VI semiconductor, and an oxide semiconductor, or may contain a group VI element and at least one of a group V element and a group V element. For example, in one exemplary embodiment the core portion C1 may contain a group IV semiconductor such as silicon (Si), germanium (Ge), or SiC, a group III-V semiconductor such as gallium arsenide ("GaAs"), aluminum gallium arsenide ("AlGaAs"), indium phosphide ("InP"), or gallium nitride ("GaN"), a group II-VI semiconductor such as cadmium sulfide ("CdS"), cadmium selenide ("CdSe"), zinc sulfide ("ZnS"), or zinc selenide ("ZnSe"), an oxide semiconductor such as a zinc (Zn) oxide or a titanium (Ti) oxide, or a compound semiconductor such as bismuth telluride ("BiTe"), bismuth selenide ("BiSe"), lead telluride ("PbTe"), or lead telluride tin ("PbTeSn").

In another exemplary embodiment, the above-mentioned materials may be a main component of the core portion C1 and the core portion C1 may further contain another material in addition to the main component. For example, in one exemplary embodiment the core portion C1 may be formed of S1, or may mainly contain S1 and additionally contain a small amount of oxygen (O) or nitrogen (N). That is, in one exemplary embodiment, the core portion C1 may be formed of crystalline S1, or may be formed of a material such as a silicon rich oxide ("SRO") or a silicon rich nitride ("SRN"). Alternative exemplary embodiments also include configurations wherein no additional component may be added. Also, exemplary embodiments include configurations wherein the core portion C1 may be doped with a conductive impurity, similar to the doping process used in a general semiconductor process, e.g., boron (B), phosphorus (P), or arsenic (As) may be used as a dopant. In the exemplary embodiments where it is present, the electrical conductivity σ of the core portion C1 may be improved due to the conductive impurity.

Exemplary embodiments include configurations wherein the shell portion S1 may contain an oxide or a nitride. For example, in one exemplary embodiment the shell portion S1 may be formed of a material such as silicon oxides ("SiOx") (here, 0<x≤2) or silicon nitrides ("SiNy") (here, 0<y≤4/3). In such an exemplary embodiment, the electrical conductivity σ of the shell portion S1 may be less than the electrical conductivity σ of the core portion C1. Exemplary embodiments also include configurations wherein the shell portion S1 may be doped with an impurity.

Exemplary embodiments of the nanoparticles NP1 may be formed of at least one selected from the group consisting of, for example, Si, Ge, bismuth (Bi), tellurium (Te), antimony (Sb), lead (Pb), tin (Sn), indium (In), silver (Ag), Zn, ytterbium (Yb), cobalt (Co), cerium (Ce), iron (Fe), cesium (Cs), other elements with similar characteristics and mixtures thereof. Exemplary embodiments of the nanoparticles NP1 may be formed from a material including a single element or a compound. In the exemplary embodiment wherein the nanoparticle NP1 forming material is a compound, the compound may be a binary, ternary, or quaternary material. Exemplary embodiments also include configurations wherein the nanoparticles NP1 may also be doped with a conductive impurity used in a general semiconductor process, as discussed above with respect to the core portion C1.

Meanwhile, exemplary embodiments include configurations wherein the core portion C1 and the nanoparticles NP1 may be crystalline and the shell portion S1 may be amorphous.

The core portion C1, the shell portion S1, and the nanoparticles NP1 may contain similar base materials. For example, in the exemplary embodiment wherein the core portion C1 is formed of Si or a SRO, the shell portion S1 may be formed of SiOx (here, 0<x≤2) and the nanoparticles NP1 may be formed of Si. However, alternative exemplary embodiments include configurations wherein at least two of the base materials of the core portion C1, the shell portion S1, and the nanoparticles NP1 may be different from each other.

Figure 2:
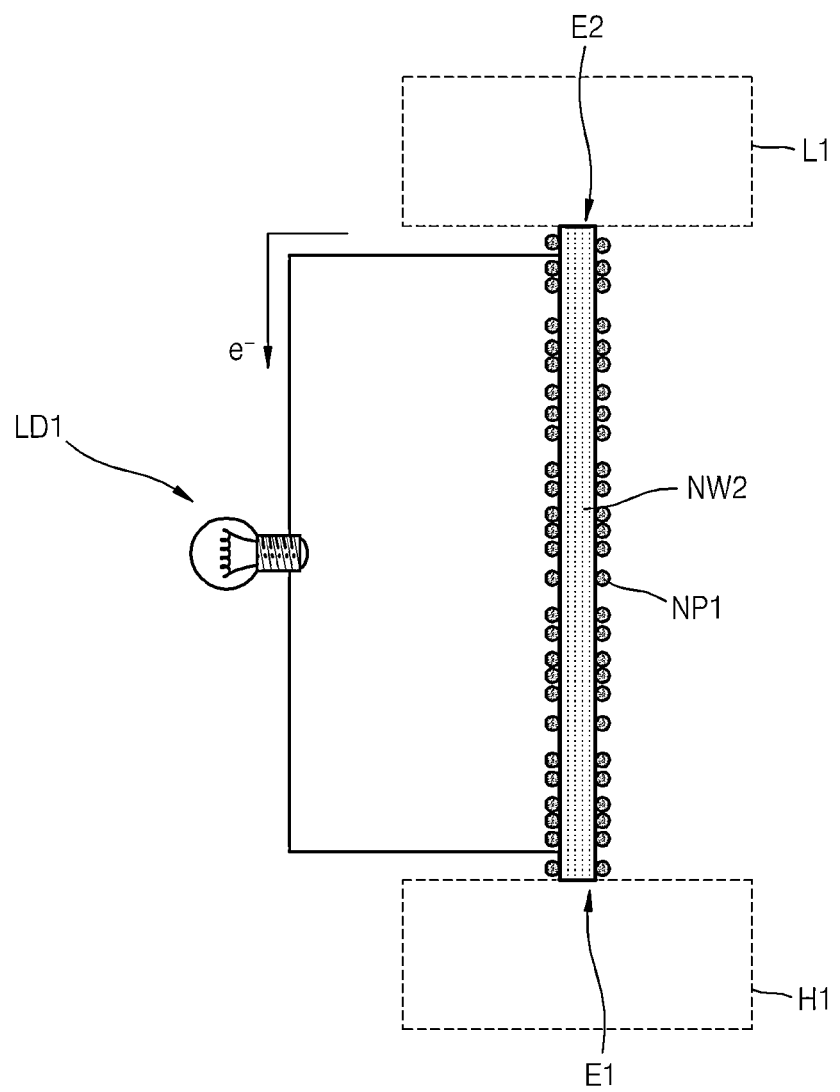
FIG. 2 is a cross-sectional diagram of another exemplary embodiment of a thermoelectric device.

According to another exemplary embodiment, the shell portion S1 may be removed from the structure illustrated in FIG. 1. In such an exemplary embodiment, the nanoparticles NP1 may be disposed only on a surface of the core portion C1 and the core portion C1 itself may be referred to as a nanowire. A structure achieved by removing the shell portion S1 from the structure illustrated in FIG. 1 is illustrated in FIG. 2. In FIG. 2, a nanowire NW2 may correspond to the core portion C1 illustrated in FIG. 1.

Although not shown, according to another exemplary embodiment, a thermoelectric device may have a structure in which a plurality of nanoparticles is formed in a nanowire formed of a single host material. In one exemplary embodiment, the host material may correspond to a material of the shell portion S1 illustrated in FIG. 1, e.g., one exemplary embodiment of such a thermoelectric device may resemble the exemplary embodiment of a thermoelectric device of FIG. 1 wherein the core C1 is removed and the shell S1 extends to fill the volume where the core C1 would otherwise have been disposed. In such an exemplary embodiment, the nanoparticles may be disposed very close to each other at intervals of, for example, about 1 nm to about 1000 nm. Some of the nanoparticles may contact each other. If the nanoparticles are disposed very close to each other or some of the nanoparticles contact each other, an electrical current may flow through the nanoparticles. Thus, in such an exemplary embodiment, some of the nanoparticles may function as the core portion C1 illustrated in FIG. 1.

Although a thermoelectric generator is obtained above using a structure in which a nanowire and nanoparticles are combined, a thermoelectric cooler may also be obtained using such a structure. An example of such a thermoelectric cooler is illustrated in FIG. 3.

Figure 3:
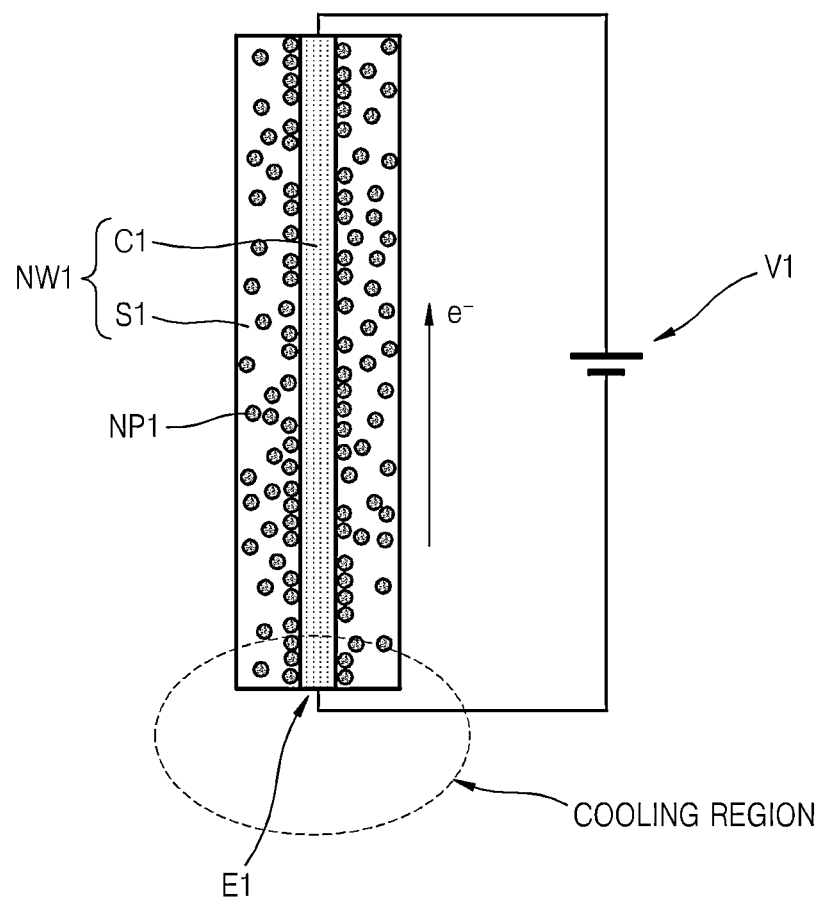
FIG. 3 is a cross-sectional diagram of another exemplary embodiment of a thermoelectric device.

Referring to FIG. 3, a power source V1 may be connected to a nanowire NW1 in which a plurality of nanoparticles NP1 is formed. If an electrical current is supplied to the nanowire NW1 using the power source V1, one end E1 of the nanowire NW1 may absorb circumferential heat due to the Peltier effect. Thus, a region around the one end E1 of the nanowire NW1 may be cooled. In another exemplary embodiment, the shell portion S1 may be removed from the structure illustrated in FIG. 3. A thermoelectric device illustrated in FIG. 3 and a device modified from the thermoelectric device may be used to reduce heat generated from, for example, an electrical circuit.

A thermoelectric device according to another exemplary embodiment may include a plurality of the exemplary embodiments of nanowires illustrated in FIGS. 1 through 3. An example of such an exemplary embodiment of a thermoelectric device is illustrated in FIG. 4.

Figure 4:
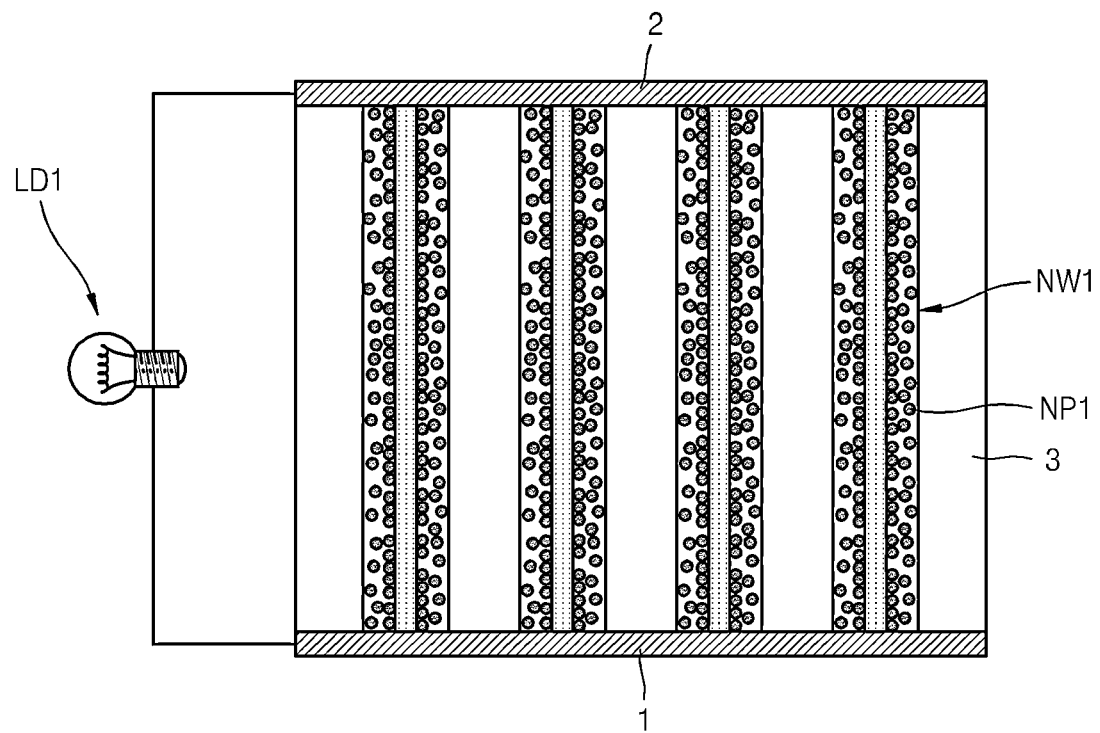
FIG. 4 is a cross-sectional diagram of another exemplary embodiment of a thermoelectric device.

Referring to FIG. 4, a plurality of nanowires NW1 each including a plurality of nanoparticles NP1 may be arranged substantially in parallel to one another. A first electrode 1 may commonly contact ends of the nanowires NW1 and a second electrode 2 may commonly contact other ends of the nanowires NW1. An insulating layer 3 disposed between the first and second electrodes 1 and 2 may fill a space between the nanowires NW1. The first and second electrodes 1 and 2 may be connected to a load device LD1. In another exemplary embodiment, the load device LD1 may be replaced by a storage battery. The thermoelectric device illustrated in FIG. 4 is an example of a thermoelectric generator including a plurality of nanowires. A thermoelectric cooler may also be formed to include a plurality of nanowires, similar to the exemplary embodiment of a thermoelectric cooler illustrated in FIG. 3. An example of such an exemplary embodiment of a thermoelectric cooler is illustrated in FIG. 5.

Figure 5:
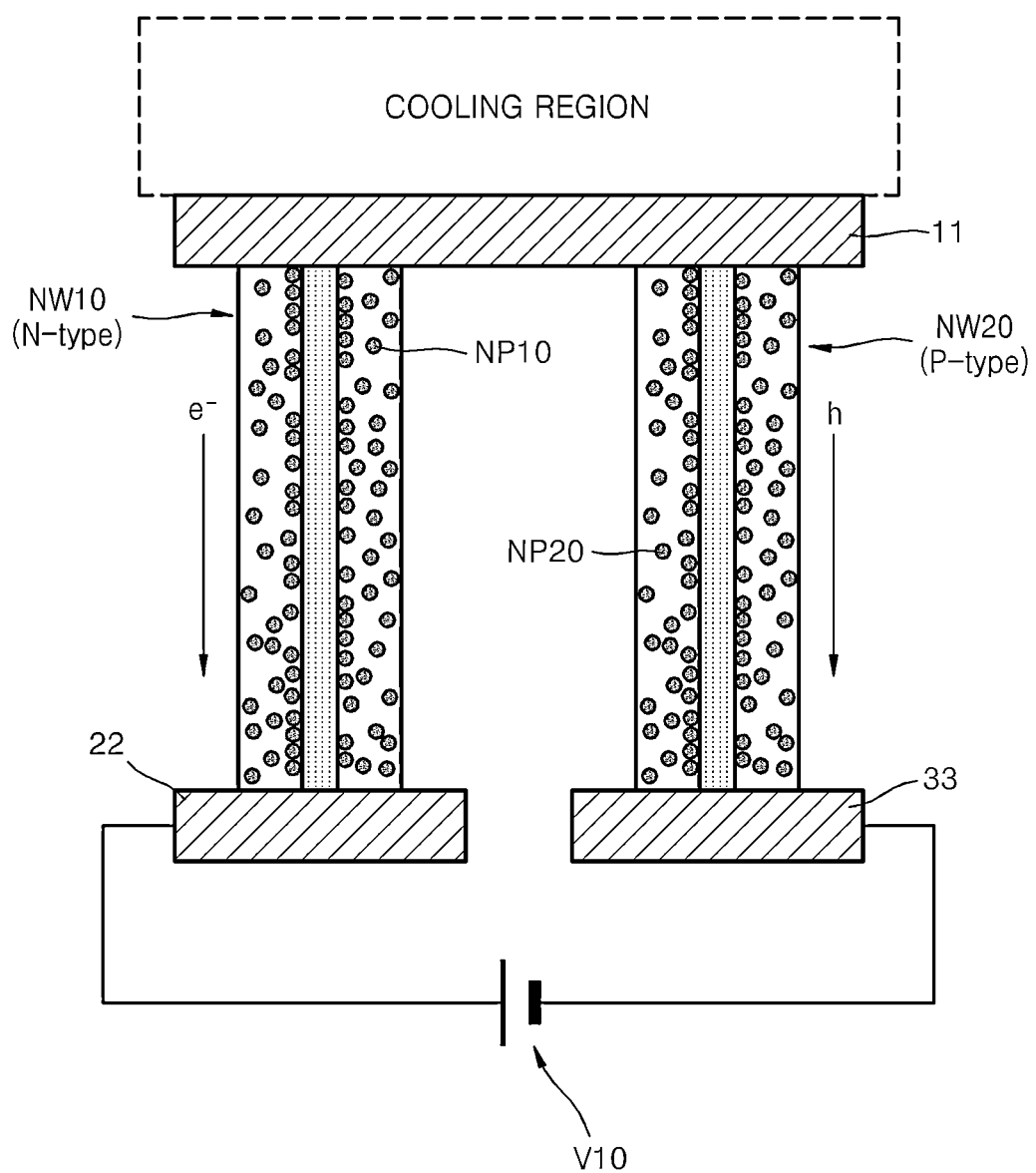
FIG. 5 is a cross-sectional diagram of another exemplary embodiment of a thermoelectric device.

Referring to FIG. 5, an n-type nanowire NW10 including a plurality of first nanoparticles NP10 and a p-type nanowire NW20 including a plurality of second nanoparticles NP20 may be arranged substantially in parallel to one another. A first electrode 11 may commonly contact first ends of the n-type nanowire NW10 and the p-type nanowire NW20. A second electrode 22 may contact a second end of the n-type nanowire NW10 and a third electrode 33 may contact a second end of the p-type nanowire NW20. The second electrode 22 and the third electrode 33 may be connected to a power source V10. If an electrical current is supplied to the n-type nanowire NW10 and the p-type nanowire NW20 using the power source V10, electrons may be flowed from the third electrode 33 to the second electrode 22 through the p-type nanowire NW20, the first electrode 11 and the n-type nanowire NW10. Meanwhile, holes may be flowed from the second electrode 22 to the third electrode 33 through the n-type nanowire NW10, the first electrode 11 and the p-type nanowire NW20. Accordingly, the first ends of the n-type nanowire NW10 and the p-type nanowire NW20 may absorb circumferential heat due to the Peltier effect. Thus a region around the first electrode 11 which contacts the first ends of the nanowires NW10 and NW20 may be cooled.

In addition, although not shown here, a thermoelectric device according to another exemplary embodiment may be used as a heat sensor. The basic structure of other heat sensors are known to those of ordinary skill in the art and thus a detailed description of a heat sensor will be omitted.

Figure 6A:
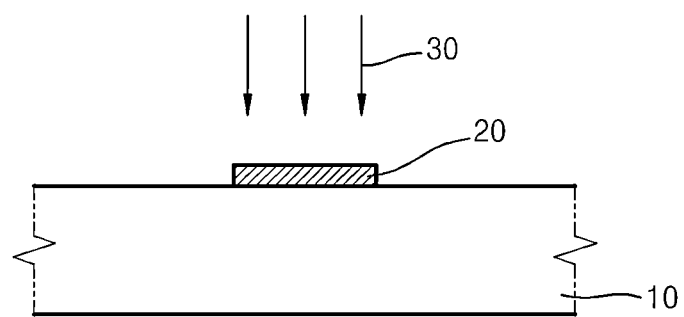
FIGS. 6A, 6B, and 6C are cross-sectional diagrams of exemplary structures for describing an exemplary embodiment of a method of manufacturing a thermoelectric device.
Figure 6B:
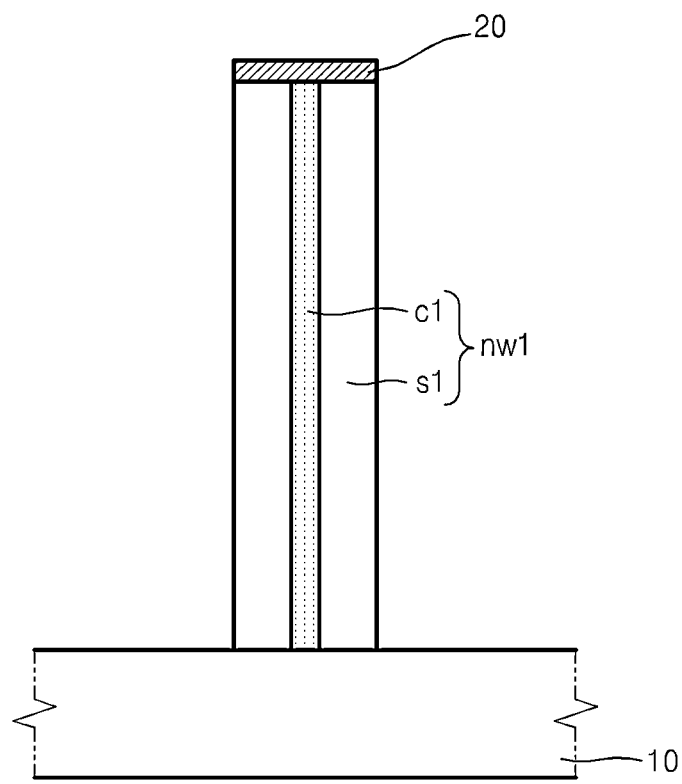
Figure 6C:
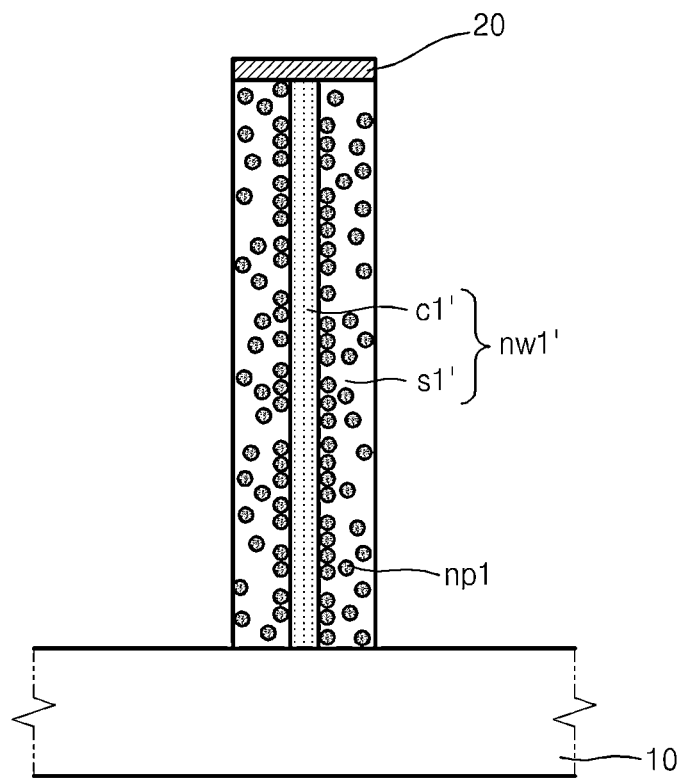

FIGS. 6A-6C are cross-sectional diagrams of exemplary structures for describing a method of manufacturing a thermoelectric device, according to another exemplary embodiment.

Referring to FIG. 6A, a catalyst layer 20 may be formed on a substrate 10. The catalyst layer 20 is used to grow a nanowire, as will be described in more detail below. Exemplary embodiments of the catalyst layer 20 may include a metal layer such as a gold (Au), nickel (Ni), Fe, Ag, aluminum (Al), Ti, palladium (Pd), or other material having similar characteristics, layer. Then, a source gas 30 of Si may be injected into a reaction chamber (not shown) into which the substrate 10 is loaded, while heating the substrate 10 at a predetermined temperature. Exemplary embodiments include configurations wherein the source gas 30 of Si may be, for example, a $SiH_4$ gas. Alternative exemplary embodiments include configurations wherein another gas may also be used in addition to, or in alternative to, the $SiH_4$ gas. The pressure of $O_2$ in the reaction chamber may be maintained at about $2\times10^{-6}$ torr to about $2\times10^{-2}$ torr. As such, as illustrated in FIG. 6B, a SRO nanowire nw1 may grow in a region where the catalyst layer 20 is formed on the substrate 10.

Referring to the exemplary embodiment shown in FIG. 6B, the SRO nanowire nw1 may grow between the substrate 10 and the catalyst layer 20. Thus, the catalyst layer 20 may be positioned on the SRO nanowire nw1. However, alternative exemplary embodiments include configurations wherein a material of the catalyst layer 20 may remain between the SRO nanowire nw1 and the substrate 10. The SRO nanowire nw1 may include a core portion c1 and a shell portion s1. The core portion c1 may be formed of Si or a SRO containing a small amount of O and the shell portion s1 may contain a SRO. In one exemplary embodiment, a portion of the shell portion s1 may be $SiO_2$. Since O may not easily penetrate to a center portion of the SRO nanowire nw1, e.g., the core portion c1 and the shell portion s1 may have a difference in composition.

A plurality of nanoparticles np1 may be formed by performing an annealing process on the SRO nanowire nw1, as illustrated in FIG. 6C. In FIG. 6C, reference numerals c1', s1', and nw1' respectively represent an annealed core portion, an annealed shell portion, and an annealed nanowire.

The annealing process may be one of various general annealing processes such as a furnace annealing process, a laser annealing process, an electron beam ("e-beam") annealing process and other similar annealing process. In one exemplary embodiment, temperature of the annealing process may be about 500° C. to about 1200° C. The nanoparticles np1 may be resultants crystallized by annealing surplus Si of the SRO nanowire nw1 (see FIG. 6B). Thus, the nanoparticles np1 may be Si particles. The nanoparticles np1 may be initially formed on a surface between the core portion c1' and the shell portion s1', and then may be formed in the shell portion s1', e.g., in one exemplary embodiment the nanoparticles np1 are first formed on the surface between the core portion c1' and the shell portion s1' before they are formed in the remaining shell portion s1'. In some exemplary embodiments, the nanoparticles np1 may be formed only on the surface between the core portion c1' and the shell portion s1', and may not be formed throughout the rest of the shell portion s1'. In one exemplary embodiment, Si content of the shell portion s1' illustrated in FIG. 6C may be less than that of the shell portion s1 illustrated in FIG. 6B. For example, the shell portion s1' illustrated in FIG. 6C may be formed of $SiO_2$ or may be formed of $SiO_2$ and a small amount of Si. The nanoparticles np1 and the nanowire nw1' illustrated in FIG. 6C may be examples of the nanoparticles NP1 and the nanowire NW1 illustrated in FIG. 1.

The exemplary structure illustrated in FIG. 2 may be achieved by removing the shell portion s1' from the structure illustrated in FIG. 6C. When the shell portion s1' is removed, the nanoparticles np1 in the shell portion s1' may also be removed. The shell portion s1' has a difference in composition from the core portion c1' and the nanoparticles np1 and thus may be selectively etched in order to remove it. Removal of the shell portion s1' is optional. Before or after removing the shell portion s1', the core portion c1 or c1' and the nanoparticles np1 may be doped with a predetermined conductive impurity. In the exemplary embodiment wherein the conductive impurity is doped before removing the shell portion s1', the shell portion s1' may also be doped with the conductive impurity. The conductive impurity may be doped during or after the nanowire nw1 formation illustrated in FIG. 6B. The conductive impurity may be a conductive impurity used in a general semiconductor process, e.g., B, P, or As, as discussed above.

Further, although not shown in FIG. 6C, electrodes may be formed at two ends of the nanowire nw1'. One of the electrodes may be formed in the substrate 10 contacting the nanowire nw1'. The other of the electrodes may be formed on the nanowire nw1'. Exemplary embodiments include configurations wherein the catalyst layer 20 on the nanowire nw1' may be used as a portion of an electrode. A plurality of nanowires nw1' may be formed on the substrate 10 and may be arranged to be in proximity to each other. In such an exemplary embodiment, a predetermined conductive layer may be formed on the nanowires nw1' so as to commonly contact the nanowires nw1', and may be used as a common electrode. A common electrode may also be formed in the substrate 10. In some exemplary embodiments, after the nanowire nw1' is formed, the nanowire nw1' may be separated from the substrate 10. In such an exemplary embodiment, the separated nanowire nw1' may be positioned on another predetermined substrate and electrodes contacting two ends of the nanowire nw1' may be formed.

In the exemplary embodiment wherein the nanowire nw1' including the nanoparticles np1 is used as a thermoelectric generator, electrodes contacting two ends of the nanowire nw1' may be connected to a predetermined electrical energy storage device (e.g., storage battery) or a load device that consumes electricity. Further, in the exemplary embodiment wherein the nanowire nw1' including the nanoparticles np1 is used as a thermoelectric cooler, electrodes contacting two ends of the nanowire nw1' may be connected to a predetermined power source.

In the above method illustrated in FIGS. 6A-6C, a source of Si used to grow a nanowire is provided in the form of a gas. That is, the source gas 30 of Si is provided in FIG. 6A and the nanowire nw1 illustrated in FIG. 6B is formed as the source gas 30 of Si is solidified, which may be referred to as a type of vapor-liquid-solid ("VLS") method. Alternative exemplary embodiments include configurations wherein a nanowire may also be formed using a solid-liquid-solid ("SLS") method, which will now be described in detail with reference to FIGS. 7A-7C.

Figure 7A:
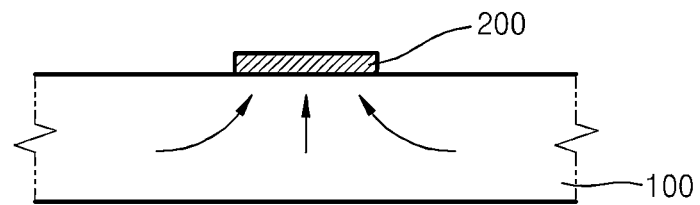
FIGS. 7A, 7B, and 7C are cross-sectional diagrams of exemplary structures for describing another exemplary embodiment of a method of manufacturing a thermoelectric device.

Referring to FIG. 7A, a catalyst layer 200 may be formed on a substrate 10. Exemplary embodiments of the substrate 100 may include a Si substrate, or other similar materials, and may be used as a source of Si. The catalyst layer 200 may be substantially the same as the catalyst layer 20 illustrated in FIG. 6A. Then, the substrate 100 may be heated at a predetermined temperature, e.g., about 400° C. to about 1300° C. Since a melting point of a portion of the substrate 100, which contacts the catalyst layer 200, may be lower than that of the other portion of the substrate 100, the portion of the substrate 100, which contacts the catalyst layer 200, may be liquefied so as to be used as a source of Si. Arrows marked in the substrate 100 show paths for providing the source of Si, e.g., the arrows mark the flow of Si from the substrate 100 towards the catalyst layer 200. In such an exemplary embodiment, $O_2$ pressure in a reaction chamber may be maintained at about $2 \times 10^{-6}$ torr to about $2 \times 10^{-2}$ torr. As such, as illustrated in FIG. 7B, a SRO nanowire nw10 may grow in a region where the catalyst layer 200 is formed on the substrate 100.

Figure 7B:
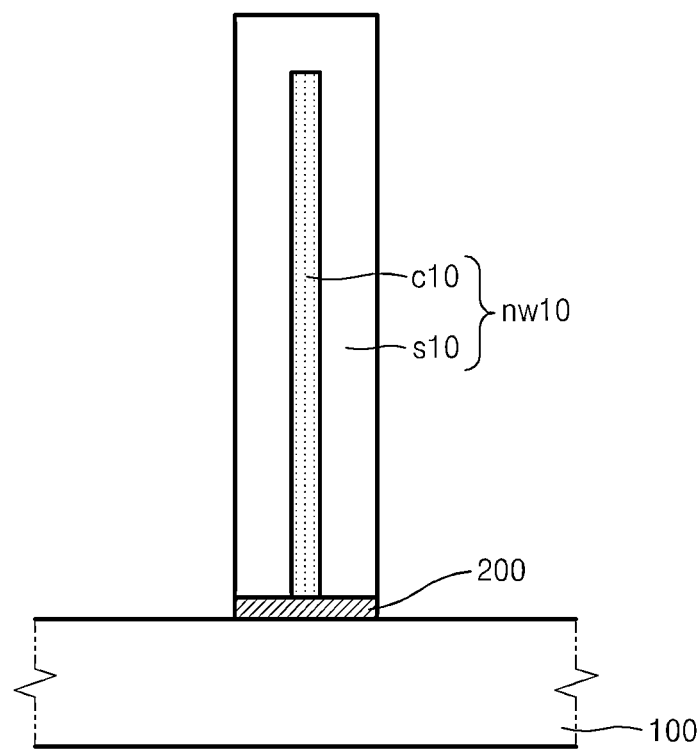

Referring to FIG. 7B, in one exemplary embodiment the SRO nanowire nw10 may grow on the catalyst layer 200. Alternative exemplary embodiments include configurations wherein a portion of the catalyst layer 200 may be disposed on top of the SRO nanowire nw10 (not shown). The SRO nanowire nw10 may include a core portion c10 and a shell portion s10. Materials of the core portion c10 and the shell portion s10 may be similar to those of the core portion c1 and the shell portion s1 illustrated in FIG. 6B.

Figure 7C:
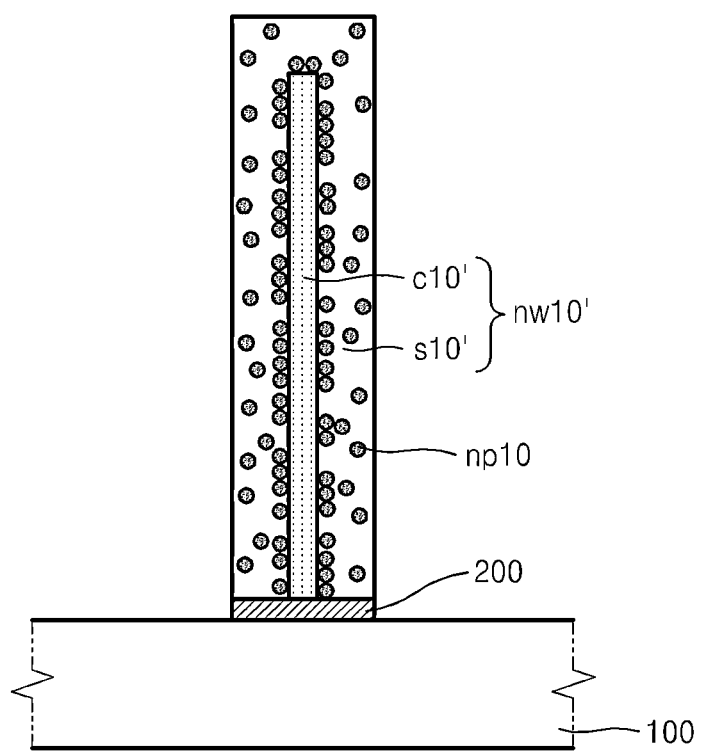

Then, a plurality of nanoparticles np10 may be formed by performing an annealing process on the SRO nanowire nw10, as illustrated in FIG. 7C. In FIG. 7C, reference numerals c10', s10', and nw10' respectively represent an annealed core portion, an annealed shell portion, and an annealed nanowire.

In one exemplary embodiment, a portion of the shell portion s10' may be removed from the structure illustrated in FIG. 7C. In such an exemplary embodiment, a top surface of the core portion c10' may be exposed by removing the shell portion s10' on the top surface of the nanowire nw10' while allowing the shell portion s10' to remain on a circumferential surface of the core portion c10' (not shown). In some exemplary embodiments, the shell portion s10' may be completely removed. Before or after removing the shell portion s10', the core portion c10 or c10' and the nanoparticles np10 may be doped with a predetermined conductive impurity. In the exemplary embodiment wherein the conductive impurity is doped before removing the shell portion s10', the shell portion s10' may also be doped with the conductive impurity. The conductive impurity may be doped during or after the nanowire nw10 formation as illustrated in FIG. 7B.

Methods of forming a SRO nanowire and then forming Si nanoparticles by annealing the SRO nanowire are described in relation to the exemplary embodiments of FIGS. 6A-6C and 7A-7C. However, the exemplary embodiments are not limited thereto. That is, the materials composition of a nanowire and nanoparticles may be changed in various ways. For example, in one exemplary embodiment the core portion c1' or c10' may contain a group IV semiconductor such as Si, Ge, or SiC, a group III-V semiconductor such as GaAs, AlGaAs, InP, or GaN, a group III-VI semiconductor such as CdS, CdSe, ZnS, or ZnSe, or an oxide semiconductor such as a Zn oxide or a Ti oxide. Also, in some exemplary embodiments the core portion c1' or c10' may contain a group VI element and at least one of a group IV element and a group V element. In such an exemplary embodiment, the core portion c1' or c10' may be formed of, for example, BiTe, BiSe, PbTe, PbTeSn or other materials having similar characteristics. In addition to the above-mentioned materials, exemplary embodiments include configurations wherein the core portion c1' or c10' may additionally contain another material such as O or N. The shell portion s1' or s10' may be formed of an oxide such as SiOx (here, 0<x≤2) or a nitride such as SiNy (here, 0<y≤4/3). The nanoparticles np1 may be formed of at least one selected from the group consisting of, for example, Si, Ge, Bi, Te, Sb, Pb, Sn, In, Ag, Zn, Yb, Co, Ce, Fe, Cs, and mixtures thereof. Exemplary embodiments include configurations wherein the nanoparticles np1 may be formed from a material including single element or a compound. If the material is a compound, the compound may be a binary, a ternary, or a quaternary material.

Also, although nanoparticles are formed by annealing a nanowire in FIGS. 6A-6C and FIGS. 7A-7C, a method of forming nanoparticles may vary. Nanoparticles may be formed regardless of a nanowire and then may be attached to the nanowire. In such an exemplary embodiment, the nanowire and the nanoparticles may have different base materials.

According to another exemplary embodiment, in addition to the VLS method and the SLS method, a nanowire may be formed using another method, such as a non-catalytic growing method. Non-catalytic growing methods are known and thus detailed descriptions of a non-catalytic growing method will be omitted.

In addition, according to forming conditions, a thermoelectric device according to another exemplary embodiment may be formed to have a structure in which a plurality of nanoparticles are formed in a nanowire formed of a single host material. In such an exemplary embodiment, the plurality of nanoparticles may be disposed in proximity to each other at intervals of, for example, about 1 nm to about 1000 nm. In some exemplary embodiments, a portion of the nanoparticles may contact each other. If the nanoparticles are close to each other or some of the nanoparticles contact each other, an electrical current may flow through the nanoparticles, e.g., an electrical current may flow preferentially along the nanoparticles as opposed to the substance in which the nanoparticles are embedded.

Figure 8:
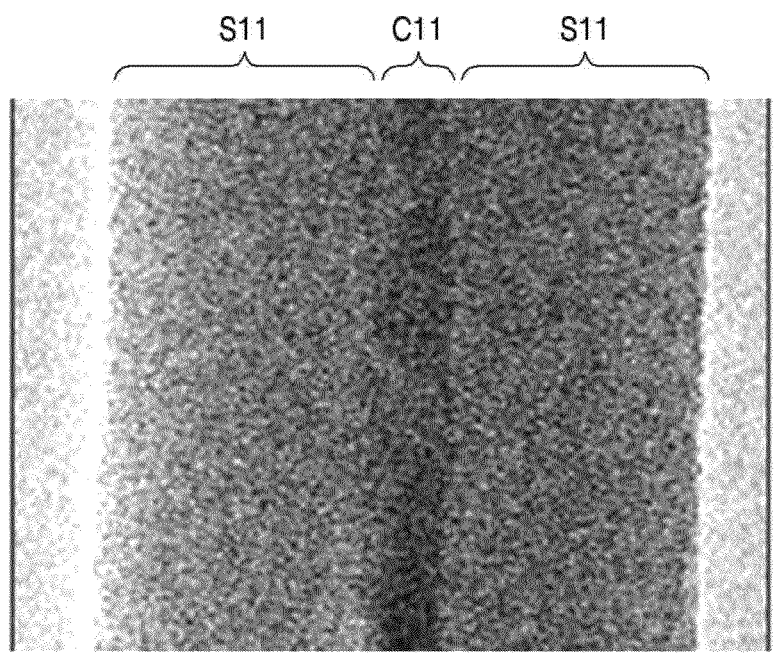
FIG. 8 is a cross-sectional microscopic image of an exemplary embodiment of a nanowire, which is captured while an exemplary embodiment of a thermoelectric device is being manufactured.

FIG. 8 is a cross-sectional microscopic image of a nanowire, which is captured while a thermoelectric device is manufactured according to another exemplary embodiment. The nanowire illustrated in FIG. 8 corresponds to the SRO nanowire nw1 illustrated in FIG. 6B before forming the nanoparticles np1 illustrated in FIG. 6C.

Referring to FIG. 8, center and outer portions of the nanowire have a difference in brightness. Such a difference in brightness shows that the center portion of the nanowire (i.e., a core portion C11) and the outer portion of the nanowire (i.e., a shell portion S11) have differences in composition and crystallinity.

Figure 9:
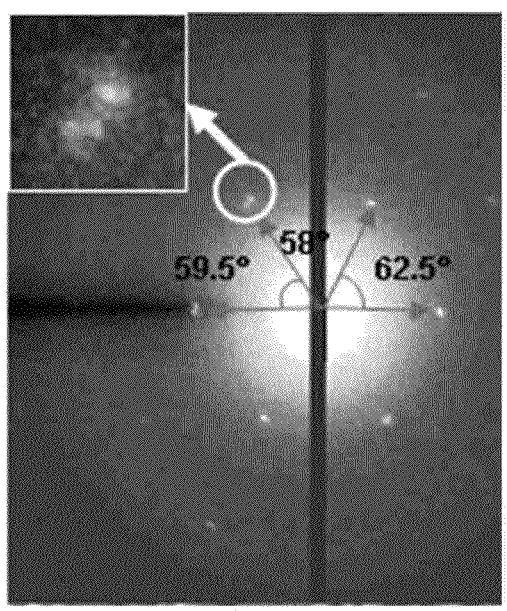
FIG. 9 is a transmission electron microscopic ("TEM") diffraction pattern of an exemplary embodiment of a core portion of the exemplary embodiment of a nanowire illustrated in FIG. 8.

FIG. 9 is a transmission electron microscopic ("TEM") diffraction pattern of the core portion C11 of the nanowire illustrated in FIG. 8.

Referring to FIG. 9, a regular diffraction pattern shows that the core portion C11 is crystalline.

Figure 10:
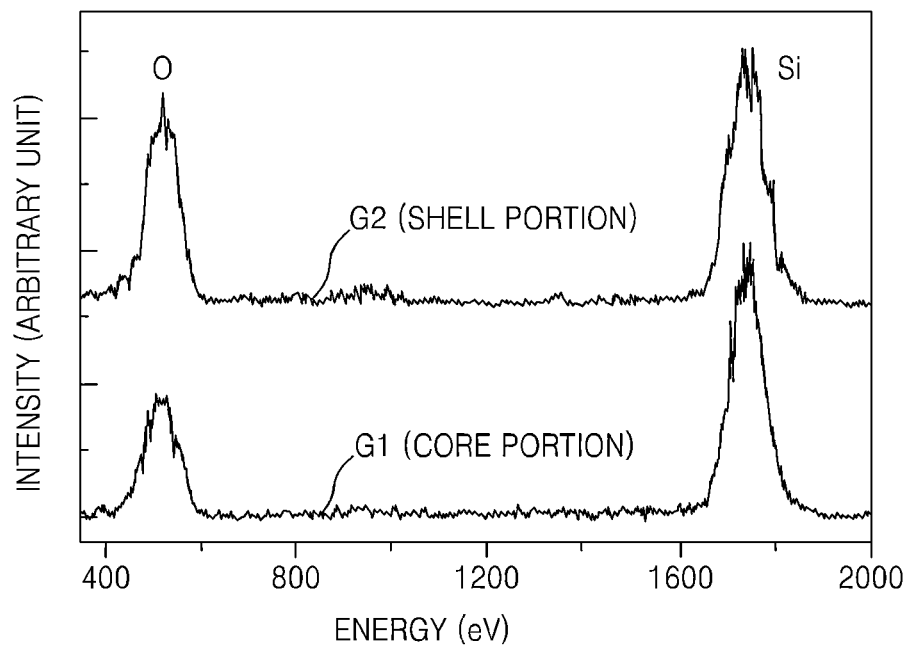
FIG. 10 is a graph showing an exemplary embodiment of energy dispersive spectroscopic ("EDS") analysis results of a core portion and a shell portion of the exemplary embodiment of a nanowire illustrated in FIG. 8.

FIG. 10 is a graph showing energy dispersive spectroscopic ("EDS") analysis results of the core portion C11 and the shell portion S11 of the nanowire illustrated in FIG. 8. A first graph G1 shows a result with respect to the core portion C11 and a second graph G2 shows a result with respect to the shell portion S11.

Referring to FIG. 10, the core portion C11 and the shell portion S11 contain similar components but have different composition ratios. The shell portion S11 has more O components than the core portion C11.

Figure 11:
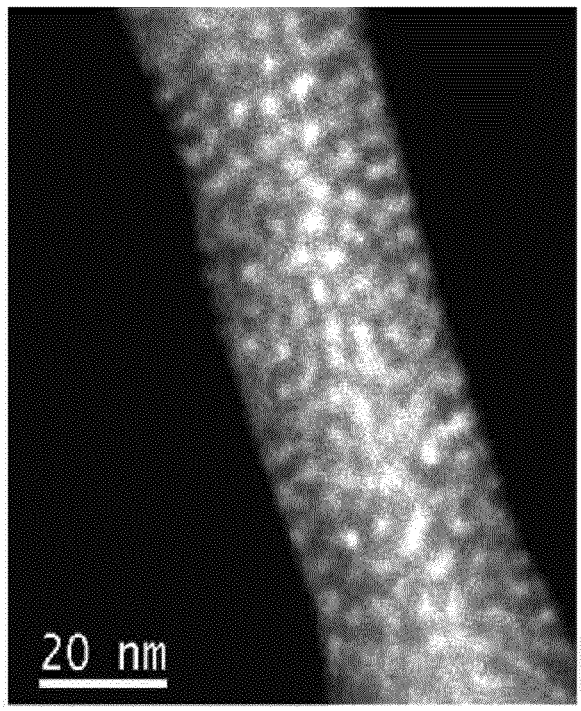
FIG. 11 is a TEM image of the exemplary embodiment of a nanowire illustrated in FIG. 8 after annealing the exemplary embodiment of a nanowire.

FIG. 11 is a TEM image of the nanowire illustrated in FIG. 8 after annealing the nanowire. The nanowire illustrated in FIG. 11 may correspond to the nanowire nw1' illustrated in FIG. 6C, in which the nanoparticles np1 are formed.

In FIG. 11, white spots in the nanowire may correspond to nanoparticles. As such, nanoparticles may be formed using a method according to one or more of the above exemplary embodiments.

In the above exemplary embodiments, nanoparticles may be used as a photoelectric conversion element, i.e., an element for receiving light and generating electricity. In more detail, charge carriers, such as electrons and holes, may be generated from the nanoparticles due to electromagnetic input, e.g., light, and the electrons and the holes may respectively flow toward one end (e.g., an anode) and another end (e.g., a cathode) of a nanowire. Photoelectric conversion caused by the nanoparticles may be similar to photoelectric conversion that occurs within a solar battery. Thus, a device according to an exemplary embodiment may be a thermoelectric device having a photoelectric conversion function.

The present disclosure should not be construed as being limited to the exemplary embodiments set forth herein. Rather, these exemplary embodiments are provided so that this disclosure will be thorough and complete and will fully convey the concept of the exemplary embodiments to those skilled in the art.

Further, although the exemplary embodiments have been shown and described herein, it will be understood by those of ordinary skill in the art that various changes and modifications in form and details may be made therein without departing from the spirit or scope of the claimed invention as defined by the following claims.

What is claimed is:

1. A thermoelectric device comprising:
   a first electrode;
   a second electrode; and
   a nanowire having nanoparticles which are disposed on an interior of the nanowire,
   wherein an end portion of the nanowire is directly connected to the first electrode, and an opposing end portion of the nanowire is directly connected to the second electrode,
   wherein the nanowire comprises a shell portion and a core portion,
   wherein all of each of the nanoparticles are only disposed between an exterior surface of the core portion and an exterior surface of the shell portion of the nanowire, and
   wherein at least some of the nanoparticles directly contact a semiconductor material of the core portion.

2. The thermoelectric device of claim 1, wherein the core portion and the shell portion comprise materials different from each other.

3. The thermoelectric device of claim 1, wherein the core portion comprises at least one of a group IV semiconductor, a group III-V semiconductor, a group II-VI semiconductor, and an oxide semiconductor, or comprises a group VI element and at least one of a group IV element and a group V element.

4. The thermoelectric device of claim 1, wherein the shell portion comprises at least one of an oxide and a nitride.

5. The thermoelectric device of claim 1, wherein the core portion includes at least one of Si, a silicon rich oxide, and a silicon rich nitride.

6. The thermoelectric device of claim 5, wherein the shell portion includes at least one of silicon oxides (SiOx) having the number of oxygen atoms x from about 0 to about 2 and silicon nitrides (SiNy) having the number of nitrogen atoms y from about 1 to about 4/3.

7. The thermoelectric device of claim 1, wherein the core portion includes a conductive impurity.

8. The thermoelectric device of claim 1, wherein the nanoparticles comprise at least one selected from the group consisting of silicon, germanium, bismuth, tellurium, antimony, lead, tin, indium, silver, zinc, ytterbium, cobalt, cerium, iron, cesium, and mixtures thereof.

9. The thermoelectric device of claim 8, wherein the nanoparticles comprise silicon.

10. The thermoelectric device of claim 1, wherein the nanoparticles have a conductive impurity.

11. The thermoelectric device of claim 1, wherein the thermoelectric device is at least one of a thermoelectric generator, a thermoelectric cooler, and a heat sensor.

12. The thermoelectric device of claim 1, further comprising:
   an additional nanowire having nanoparticles, which are disposed on an interior of the additional nanowire,
   wherein an end portion of the additional nanowire is directly connected to the first electrode, and an opposing end portion of the additional nanowire is directly connected to the second electrode,
   wherein the additional nanowire comprises a shell portion and a core portion, and
   wherein all of the nanoparticles of the additional nanowire are disposed between an exterior surface of the core portion of the additional nanowire and an exterior surface of the shell portion of the additional nanowire.

13. The thermoelectric device of claim 12, wherein the nanowire and the additional nanowire comprise at least one n-type nanowire and/or at least one p-type nanowire.

14. The thermoelectric device of claim 1, wherein the nanoparticles comprise a photoelectric element.

15. A method of manufacturing a thermoelectric device, the method comprising:
   providing a first electrode;
   providing a second electrode;
   providing a nanowire comprising a shell portion and a core portion;
   providing a plurality of nanoparticles between an exterior surface of the core portion and an exterior surface of the shell portion of the nanowire, wherein all of the nanoparticles are disposed between the exterior surface of the core portion and the exterior surface of the nanowire, and at least some of the nanoparticles directly contact a semiconductor material of the core portion; and
   directly connecting an end portion of the nanowire to the first electrode, and directly connecting an opposing end portion of the nanowire to the second electrode.

16. The method of claim 15, wherein the nanowire is a silicon rich oxide nanowire.

17. The method of claim 15, wherein the nanowire is provided by using one of a vapor-liquid-solid method, a solid-liquid-solid method, and a non-catalytic growing method.

18. The method of claim 15, wherein providing the nanoparticles comprises annealing the nanowire.

19. The method of claim 15, further comprising doping the nanowire with a conductive impurity.

20. The method of claim 15, further comprising etching a surface portion of the nanowire after providing the plurality of nanoparticles, if the nanoparticles are provided in the interior of the nanowire.

* * * * *